US005463322A

United States Patent [19]

Kwasnick et al.

[11] Patent Number: 5,463,322

[45] Date of Patent: Oct. 31, 1995

[54] METHOD OF LOCATING COMMON ELECTRODE SHORTS IN AN IMAGER ASSEMBLY

[75] Inventors: Robert F. Kwasnick, Schenectady; Joseph M. Pimbley, Croton-on-Hudson, both of N.Y.

[73] Assignee: General Electric Company, Schenectady, N.Y.

[21] Appl. No.: 161,037

[22] Filed: Dec. 3, 1993

[51] Int. Cl.[6] .......... G01R 31/08

[52] U.S. Cl. .......... 324/522; 324/523; 324/527; 324/537; 359/54

[58] Field of Search .......... 324/522, 523, 324/527, 537, 529; 345/904; 359/59, 54

[56] References Cited

U.S. PATENT DOCUMENTS

| | | | |
|---|---|---|---|
| 4,752,118 | 6/1988 | Johnson | 350/334 |
| 5,073,754 | 12/1991 | Henley | 324/529 |
| 5,303,074 | 4/1994 | Salisbury | 359/59 |

*Primary Examiner*—Kenneth A. Wieder
*Assistant Examiner*—Kourosh Cyrus Khosravi
*Attorney, Agent, or Firm*—Donald S. Ingraham; Marvin Snyder

[57] ABSTRACT

A process for locating common electrode shorts in an electronic array, such as an x- y- addressed imager assembly having a short circuit between an address line and an overlying common electrode layer, includes the steps of applying a test voltage to the addressed line shorted to the common electrode, measuring current at each of a plurality of common electrode contact points disposed at selected intervals along selected edges of the common electrode, and processing the respective measured currents in accordance with a selected relationship to localize a short circuit location along the length of the shorted address line. In imager assembly arrangements in which it is possible to measure currents on opposite sides of the common electrode disposed substantially perpendicular to the orientation of the shorted address line, the selected relationship is $I_{A-N}/I_{a-n}=(L-X)/X$, wherein: $I_{A-N}$ are the measured currents from common electrode contact points along one common electrode opposite edge; $I_{a-n}$ are the measured currents from common electrode contact points along the the other common electrode opposite edge; L represents the length of the shorted address line; and X represents the point of the short circuit as distance from the common electrode first opposite edge. An x- y- addressed imager assembly adapted for use of this method includes a common electrode having more than two electrical contact points disposed at selected intervals along each edge of the common electrode that corresponds to a lateral boundary of the imager assembly.

13 Claims, 3 Drawing Sheets

METHOD OF LOCATING COMMON ELECTRODE SHORTS IN AN IMAGER ASSEMBLY

RELATED APPLICATIONS

This application is related to the application entitled "Imager Assembly with Multiple Common Electrode Contacts", Ser. No. 08/161,030, filed concurrently herewith, which is assigned to the assignee of the present invention and which is incorporated herein by reference.

BACKGROUND OF THE INVENTION

This invention relates generally to radiation imager arrays and to repair of shorts between the common electrode and other components in an imager, and in particular relates to determining the location of such shorts in an x-y addressed imager array.

Complex electronic devices are commonly formed on substrates in fabrication processes involving the deposition and patterning of multiple layers of conductive, semiconductive, and dielectric materials so as to form multiple individual electronic components. For example, large area imager arrays (e.g., having an area of about 25 $cm^2$ or more) are commonly fabricated on a wafer and contain photodiodes and circuitry for reading the output of the photodiodes, such as address lines and switching components (e.g., thin film transistors (TFTs)). In such an array a common electrode layer extends over the top of almost the entire pixel array, with the off-the-wafer contacts for the common electrode being disposed at the four corners of the common electrode. Defects in such imager arrays can result from, among other causes, impurities in materials deposited to form the various components. One example of such an impurity-based defect is a short circuit between the common electrode and an underlying address line in the pixel array. Such short circuits disrupt the desired electrical connections between devices in the array and seriously degrade the performance of one or more of the individual electronic components on the wafer, often to the point of making an entire wafer unusable.

It is often difficult to locate a short circuit to the common electrode as the electrode extends over substantially the entire upper surface of the array, thus covering the entire length of each address line, including the address line to which it is shorted. Traditionally, a detailed visual inspection of the array has been required to attempt to locate the short circuit, a process that is time consuming and not always successful in locating the site of the short circuit. Procedures and imager structures that enable one to lessen the time to find the defect hasten the repair effort and thus reduce the overall cost of fabricating the array and improve the manufacturing yield of the array fabrication process.

The object of this invention is to provide a method to electrically localize the position of a short circuit in an electronic-array structure between the common electrode and other components in the array.

Another object of this invention is to provide a method for localizing the position of a short circuit in an array in which currents are measured from multiple contacts along opposite edges of the common electrode, and to provide a method for localizing the position of a short circuit in an array in which currents are measured from multiple contacts along adjoining sides of the common electrode.

SUMMARY OF THE INVENTION

In accordance with this invention, a process for locating common electrode shorts in an x- y- addressed imager assembly having a short circuit between an address line and an overlying common electrode includes the steps of applying a test voltage to the address line shorted to the common electrode, measuring current at each of a plurality of common electrode contact points disposed at selected intervals along selected edges of the common electrode (which contact points are uniformly biased, typically grounded), and processing the respective measured currents in accordance with a selected relationship to localize a short circuit location along the length of the shorted address line. In imager assembly arrangements which are adapted to be able to measure currents on opposite sides (or edges) of the common electrode, edges that are disposed substantially perpendicular to the orientation of the shorted address line, the selected relationship is $I_{A-N}/I_{a-n}=(L-X)/X$, wherein: $I_{A-N}$ represents the measured currents from common electrode contact points along one common electrode opposite edge; $I_{a-n}$ represents the measured currents from common electrode contact points along the other common electrode opposite edge; L represents the length of the shorted address line; and X represents the point of the short circuit as distance from the common electrode first opposite edge.

In imager assembly arrangements configured so that common electrode contact points are not available on opposite sides of the common electrode, current readings are taken from the respective plurality of common electrode contact points on adjoining sides (or edges) of the common electrode. The processing of the respective measured currents is in accordance with the following selected relationship:

$$X=[\tan((\pi/2)(I_{parallel\ edge}/(I_{parallel\ edge}+I_{perpendicular\ edge})))][d]$$

wherein X is the distance of the short along the shorted address line from the adjoining common electrode edge; $I_{parallel\ edge}$ represents the sum of currents from contacts along the adjoining common electrode edge that is substantially oriented parallel to the shorted address line; $I_{perpendicular\ edge}$ represents the sum of currents from contacts along the common electrode edge that is substantially oriented perpendicular to the shorted address line; and, d is the distance of the shorted address line from the adjoining common electrode edge oriented parallel to the shorted address line and from which $I_{parallel\ edge}$ is measured.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1A:
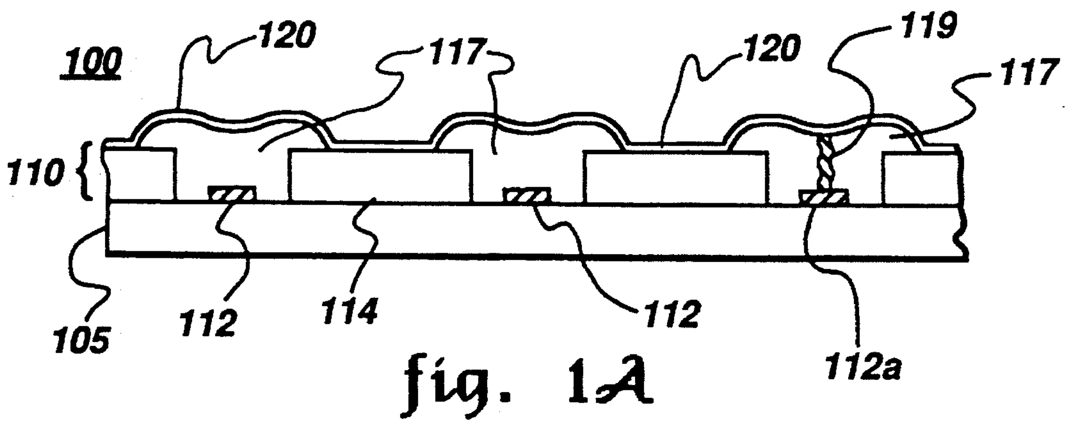
FIG. 1(A) is a cross-sectional view of a portion of an imager assembly having an undesired conductive path between the common electrode and an address line in the array.

A radiation imager assembly 100, such as an x-ray imager, typically comprises a substrate 105 on which a photosensor array 110 is disposed, as is illustrated in FIG. 1(A). Photosensor array 110 typically comprises a plurality of electronic components, such as address lines 112, photodiodes 114, and switching devices, e.g., thin film transistors (TFTs) (not shown) that are disposed to selectively couple respective photodiodes 114 to selected address lines.

Figure 1B:
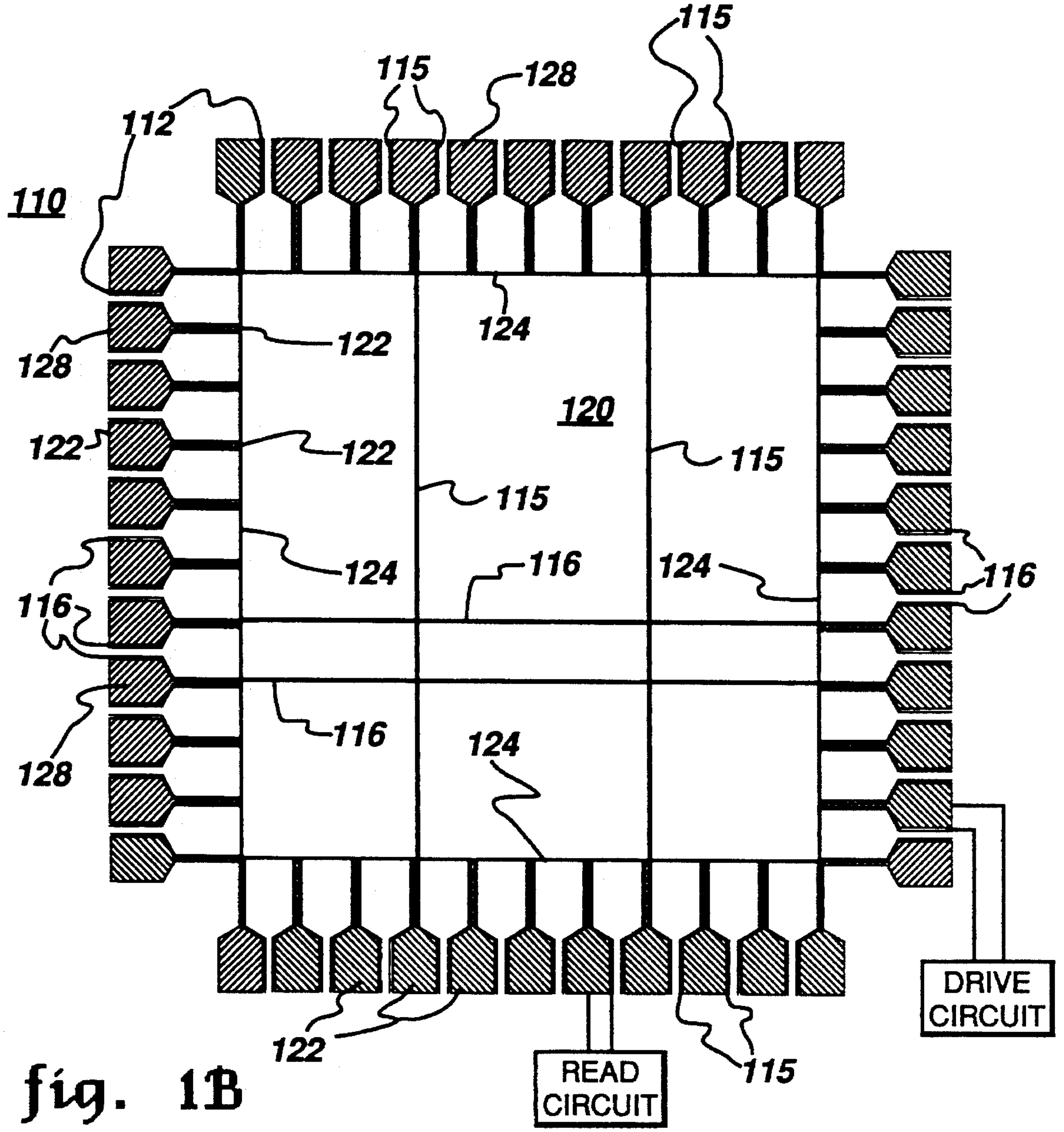
FIG. 1(B) is a plan view of a photosensor array having a common electrode with a plurality of electrical contact pads along its edges.

Imager assembly is an x- y- addressed imager, that is the plurality of address lines for addressing individual pixels (not shown) in photosensor array 110 comprises a plurality of data lines 115 (FIG. 1(B)), each of which is oriented substantially along a first axis of imager assembly 100, and a plurality of scan lines 116, each of which is oriented substantially along a second axis of imager assembly 100, the first and second axes being disposed substantially perpendicular to one another. For ease of illustration in FIG. 1(B), only a few of data lines 115 and scan lines 116 are shown extending across array 110, although each set of such address lines would typically extend across the array. Scan and data lines are arranged in rows and columns so that any one pixel in photosensor array 110 is addressable by one scan line and one address line. Address lines 112 comprise a conductive material, such as molybdenum, aluminum, or the like.

Photodiodes 114 are electrically coupled to address lines 112 via TFTs (not shown). Only a portion of each photodiode 114 is illustrated in the particular cross section of FIG. 1(A); photodiodes 114 comprise the active portion of the array, that is, the portion of the array that is responsive to incident photons and that produces the electric signals corresponding to the detected incident radiation. Each photodiode typically comprises a layer of intrinsic amorphous silicon disposed between a layer of silicon doped to exhibit p type conductivity and a layer of silicon doped to exhibit n type conductivity.

A dielectric layer 117 (FIG. 1(A) is disposed over address lines 112 and other components (such as TFTs) and photodiodes 114 with the exception of a contact area on the upper surface of each photodiode. Dielectric layer 117 comprises an organic dielectric material, such as polyimide or the like, or alternatively an inorganic dielectric material, such as silicon nitride or silicon oxide, or alternatively a combination of organic and inorganic dielectric materials. Common electrode 120 is disposed over dielectric layer 117 and photodiodes 114 so as to be in electrical contact with a selected upper surface portion of each photodiode 114. Common electrode 120 typically comprises a transparent conducting oxide such as indium tin oxide or the like.

A representative short circuit condition is illustrated in FIG. 1(A). The short circuit condition results from, for example, a defect 119 in dielectric material 114 that comprises an impurity in the dielectric material, such as an electrically conductive material that became entrained with the dielectric material when it was deposited or that is an artifact from the deposition of other components in the array. As illustrated in FIG. 1(A), defect 119 is disposed such that it is electrically coupled to common electrode 120 and to address line **112*a* such that a conductive path between address line 112*a* and common electrode 120 exists. Such a conductive path is undesired as it shorts the two conductive layers together, degrading the signal generated by the pixels coupled to that address line. Until such time as the short to the affected address line 112*a*** is isolated, operation of the whole photosensor array is degraded.

Location of the site of the short circuit is necessary to repair photosensor array 110, such as by removing a portion of common electrode 120 to electrically isolate the defect, as is described in the copending application entitled "Method of Isolating Vertical Shorts in an Electronic Array", Ser. No. 08/115,082, filed 2 September 1993, which is assigned to the assignee of the present application and incorporated herein by reference. Typically the particular address line that is shorted is readily determined by measuring the resistance between each address line and the common electrode. Locating the particular site of the short circuit along the length of the shorted address line, however, has been time consuming, typically requiring an extensive visual inspection of the entire length of the address line.

Common electrode 120 comprises a plurality of electrical contacts 122 that are disposed at selected intervals along the length of edges 124 of the common electrode as shown in FIG. 1(B). The plurality of electrical contacts comprises more than two electrical contacts 122 along each edge 124, that is, the plurality of electrical contacts are disposed along the length of the edge of common electrode 120 and not just at the corner edges of the electrode. Typically, electrical contacts 122 are disposed at equal intervals along one edge 124 of the common electrode, that is, adjacent electrical contacts 122 are equidistant from one another. For purposes of the method of this invention, the equal selected intervals are typically not more than 12% of the length of the edge of the common electrode on which the contact pads are disposed, which, depending on the size of array 110, corresponds to a distance interval between edge electrical contacts 122 in the range between about 0.5 cm and 5 cm. One consideration in determining the length of the selected interval between contact points 122 is that the location generated by the selected relationship (the algorithm set out in detail below) used in the method of localizing the short circuit becomes less accurate as the value of the distance of the short circuit from the common electrode edge approaches the value of the selected interval. As a consequence, it is generally desirable to have a small selected interval to enhance the effectiveness of the method of locating the short circuit. Further, electrical contacts 122 typically am disposed so as to be juxtaposed with connections for address lines 112 (that is, data lines 115 along two opposite edges and scan lines 116 along the other set of opposite edges of array 110) at the edge of imager assembly 100.

In accordance with this invention, electrical contacts 122 are disposed along at least two edges of common electrode 120 in each photosensor array 110, and commonly are disposed along all four edges of the common electrode. An imager assembly 100 comprises at least one photosensor array 110 which in turn advantageously comprises a common electrode having electrical contacts 122 disposed on all four edges of the electrode. In some large area imagers, e.g., having an area greater than about 200 $cm^2$ (such as a 15 cm×15 cm array), multiple photosensor arrays 110 are disposed together to compdse the entire array. In such an arrangement, typically at least two edges of each photosensor array correspond to the lateral boundaries (that is the edges of the entire assembly) of imager assembly 100 and electrical contacts 122 are disposed along the edges of the respective common electrode 120 that correspond to the lateral dimensions of imager assembly 100.

Figure 1C:
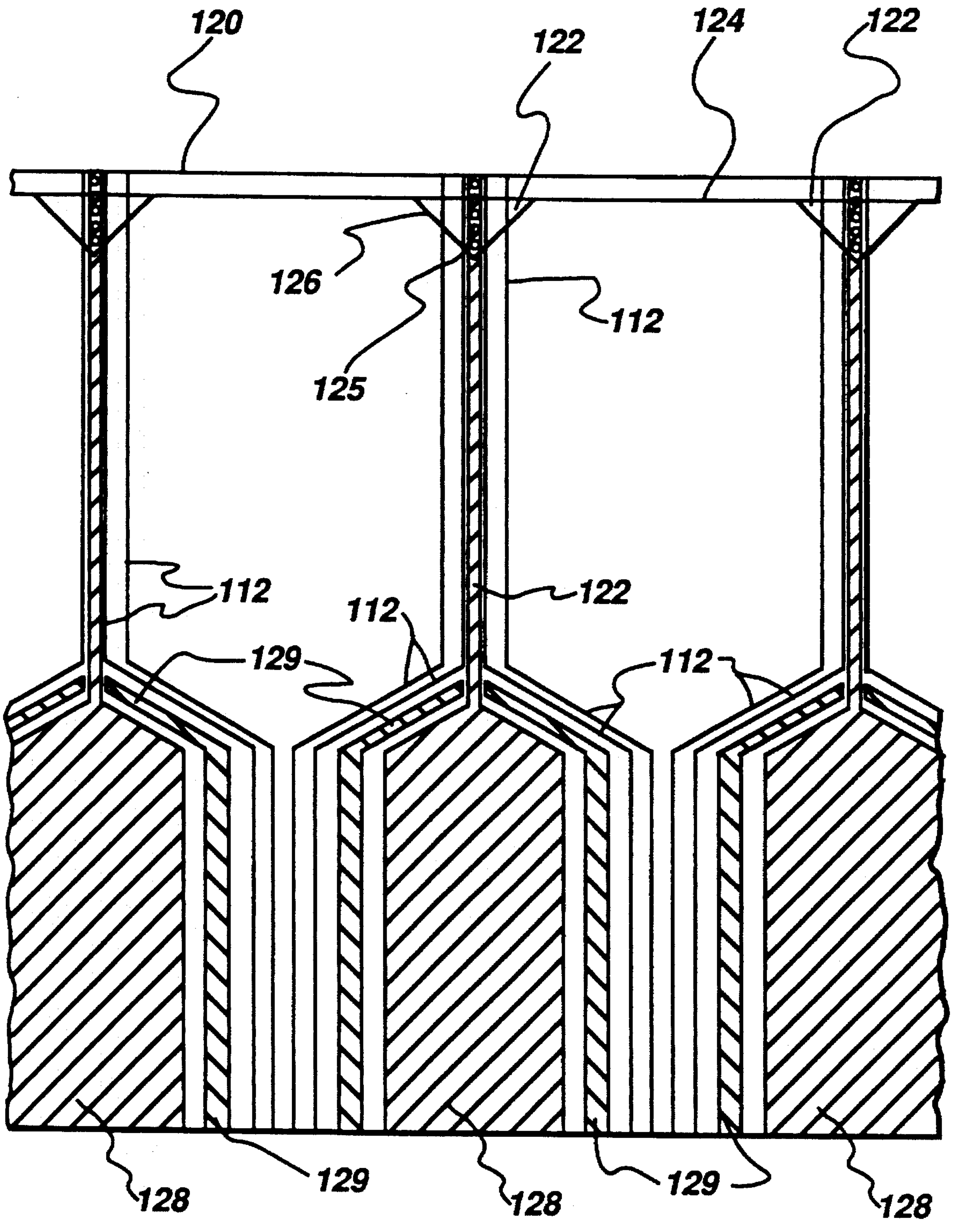
FIG. 1(C) is a detail view of a portion of a photosensor array having common electrode edge contact pads.

A detailed view of an electrical contact 122 is illustrated in FIG. 1(C). A portion of common electrode 120 and electrode edge 124 appear at the top of that figure. Electrical contact 122 comprises a protrusion of electrically conductive material that extends from edge 124 of the common electrode and is disposed so as to facilitate an electrical connection to that portion of common electrode 120. Specifically, electrical contact 122 comprises an extension 126 from the main body of common electrode 120 and a contact pad 128 to which extension 126 is electrically coupled. Extension 126 comprises the same conductive material as common electrode 120 (e.g., indium tin oxide) such that extension 126 is readily formed in the deposition and patterning processes for formation of common electrode 120. Extensions 126 are further typically disposed at a point in photosensor array 110 at which address lines 112 extend from the array (for purposes of electrical contact to components off of the wafer). Contact pad 128 comprises a conductive material such as molybdenum, chromium, or the like, or alternatively, multiple layers of conductive material, such as indium tin oxide over molybdenum.

As illustrated in FIG. 1(C), in most imager assemblies address lines 112 are arranged in a pattern in which address lines extending from the array are disposed relatively close together so that the lines are readily coupled to off-the-wafer readout circuits. Contact pad 128 typically is disposed so as to be electrically insulated from address lines 112 at the edge of the wafer. Electrical coupling between extension 126 and contact pad 128 is typically through vias 125 (as the metal comprising contact pad 128 and the transparent conducting oxide comprising extension 126 are typically disposed at different vertical levels in imager assembly in accordance with normal fabrication techniques). Guard contacts 129 are also typically disposed on the edge of the wafer between the common electrode and address line contacts. Guard contacts 129 typically are biased at a voltage similar (e.g., within about 1 Volt) of the voltage of the address line extending from the respective edge of the array on which guard contacts 129 are disposed so as to provide a voltage sink to prevent leakage between address lines 112 and common electrode contact points 122. That is, leakage from address lines 112 or the common electrode contacts 122 is drawn away by guard contact 129 and does not leak to either the common electrode or address line. Alternatively, the guard contacts are biased with a voltage similar to the bias on the data line (since leakage to data lines presents the greatest potential for introduction of noise into the imager output).

Figure 2A:
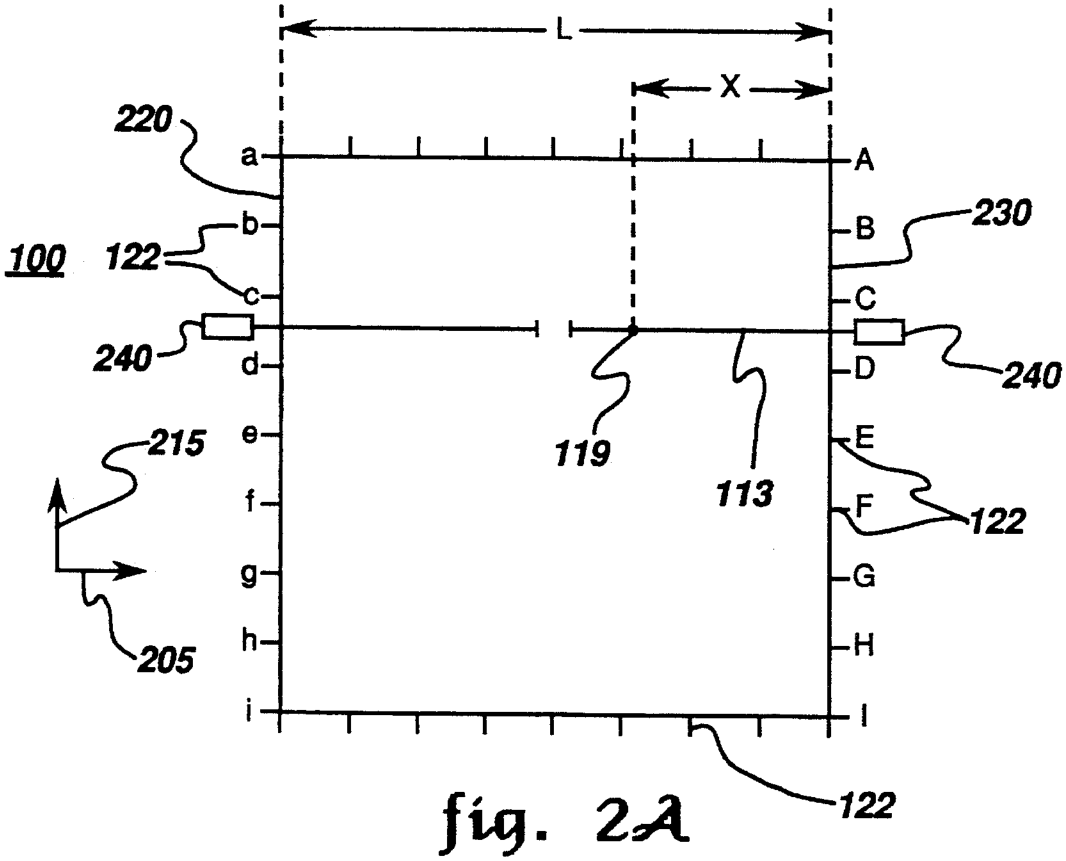
FIG. 2(A) illustrates a photosensor array addressable from opposite sides and having a common electrode short that is locatable in accordance with this invention.

A short circuit in an imager assembly 100 comprising a common electrode having electrical contacts 122 as described above is readily localized in accordance with the following method. In one embodiment of this invention, a short circuit is located in an imager assembly having common electrode electrical contacts 122 on opposite sides of the imager assembly, as illustrated in FIG. 2(A). Shorted address line 113, which is shored to the common electrode at short circuit site 119, is determined in accordance with known procedures, such as measuring the resistance between individual address lines and the common electrode. For purposes of illustration and not limitation, shored address line 113 illustrated in FIG. 2(A) is disposed along a first axis 205 of imager assembly 100; a second axis 215 of imager assembly is oriented substantially perpendicular to first axis 205. The two axes correspond to the orientation in imager assembly 100 of the rows and columns of address lines, e.g., scan and data lines. Further, shored address line 113 is illustrated as having a break in the middle of the array, as is sometimes done for noise reduction purposes in large area imagers that are driveable from all four sides of the array so as to reduce the total capacitance of the data line. The method of this invention is equally applicable to imager assemblies in which address lines are not intentionally opened.

In accordance with this invention, a test voltage is applied to shored address line 113; typically the remaining address lines are unbiased so that they are electrically floating during this procedure. The test voltage has an absolute value that is typically in the range of about 1 V to 10 V, and is applied by a voltage source 240 electrically coupled to shored address line 113. Currents are then measured, using standard current-measuring techniques and equipment at electrical contacts 122 that are disposed along a first edge 220 of common electrode 120 and along a second edge 230 of common electrode 120. First and second edge 220, 230, are each oriented along second axis 215, that is, they are disposed perpendicular to shorted address line 113. Electrical contacts 122 from which current measurements are taken, that is contacts 122 disposed along first and second edge 220, 230, respectively, are grounded. Contacts 122 disposed along edges of the common electrode 120 that are oriented parallel to the shorted address line are "floating" (i.e., unbiased, or no voltage applied).

The current measured at each respective electrical contact 122 along first edge 220 (e.g., $I_a+I_b+\ldots I_i$ corresponding to the electrical contact points illustrated in FIG. 2(A)) is summed, and the current measured from each electrical contact along second edge 230 is also summed ($I_A+I_B+\ldots I_I$ as illustrated in FIG. 2(A)). The measured currents are then processed in accordance with the following selected relationship to determine the short circuit location, expressed as a distance "X", along shorted address line 113:

$$I_{A-N}/I_{a-n}=(L-X)/X$$

wherein:

$I_{A-N}$ represents the sum of measured currents from common electrode contact points along common electrode second edge 230;

$I_{a-n}$ represents the sum of measured currents from common electrode contact points along common electrode first edge 220;

L represents the length of the shorted address line; and

X represents the point of the short circuit as distance from the common electrode first opposite edge.

As is illustrated in FIG. 2(A), determination of the distance "X" enables one to localize the short circuit along the shorted address line, thereby reducing the time that is necessary to find and repair the defect. Further, as used herein, the step of processing the respective measured currents typically includes the steps of applying (that is, electrically coupling) the measured currents to the input of a processor device (such as a computer or other chip of electronic components) programmed to manipulate said measured currents in accordance with the selected relationship. Alternatively, an operator can manually perform the mathematical functions of the selected relationship to the measured current data.

Figure 2B:
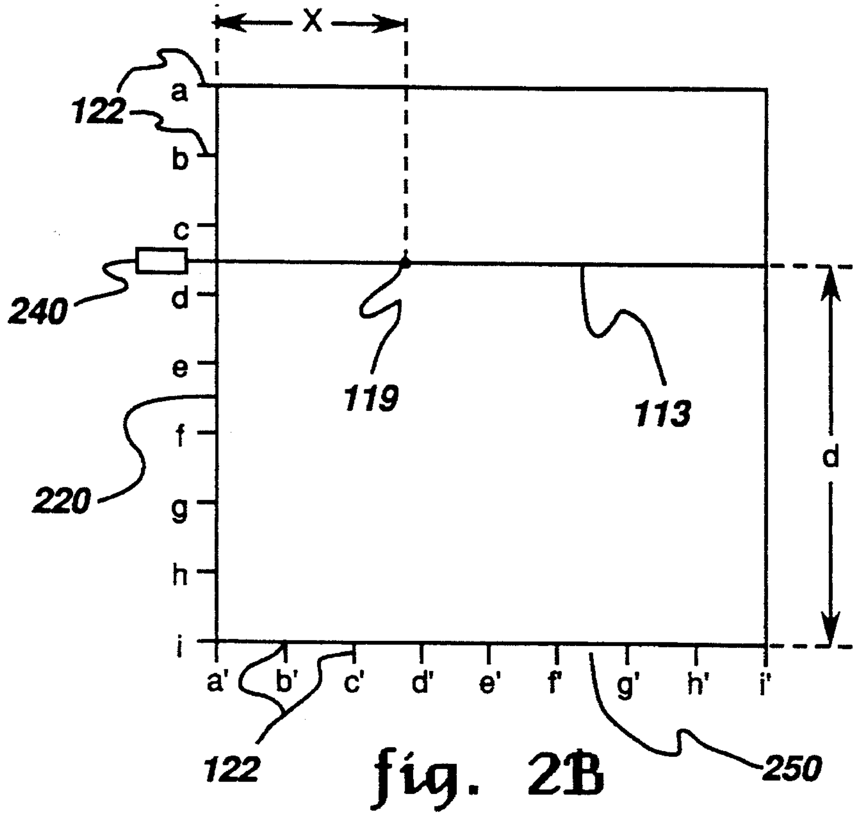
FIG. 2(B) illustrates a photosensor array addressable from adjoining sides and having a common electrode short that is locatable in accordance with this invention.

An imager assembly 100 having a photosensor array 110 that is not addressable from opposite sides, such a photosensor array that forms one portion of a larger array, is illustrated in FIG. 2(B). Photosensor array 110 comprises electrical contacts 120 disposed along adjoining (or adjacent) edges of one array, that is edges of photosensor array that correspond to the lateral boundaries (or sides) of imager assembly 100. A test voltage is applied to shorted address line 113. The test voltage typically has an absolute value in the range of about 1 V to 10 V, and is applied by a voltage source 240 electrically coupled to shorted address line 113. Currents are then measured, using standard current-measuring techniques and equipment, at electrical contacts 122 that are disposed along a first edge 220 of common electrode 120 and along a second edge 250 of common electrode 120. Electrical contacts 122 from which current measurements are taken, that is contacts 122 disposed along first edge 220 and second edge 250, are grounded (or held at a common potential). The other edges of the common electrode are "floating" (i.e., unbiased or no voltage applied). First edge 220 is oriented along second axis 215 (that is perpendicular to shorted address line 113 as illustrated in FIG. 2(B)) and adjoins second edge 230, which is oriented along first axis 205 (that is parallel to shorted address line 113 as illustrated in FIG. 2(B)). The current measured at each respective electrical contact 122 along first edge 220 (e.g., $I_a+I_b+\ldots I_i$ as illustrated in FIG. 2(B)) is summed as is current measured from each electrical contact along second edge 250 ($I_{a'}+I_{b'}+\ldots I_{i'}$ as illustrated in FIG. 2(B)). The measured currents are then processed in accordance with the following selected relationship to determine the short circuit location, expressed as a distance "X" along shored address line 113:

$$X=[\tan((\pi/2)(I_{parallel\ edge}/(I_{parallel\ edge}+I_{perpendicular\ edge})))][d]$$

wherein:

X is the distance of the short along the shorted address line from the adjoining common electrode edge;

$I_{parallel\ edge}$ represents the sum of currents from common electrode electrical contacts 122 along the adjoining common electrode edge that is substantially oriented parallel to the shorted address line, that is, second edge 250 as illustrated in FIG. 2(B);

$I_{perpendicular\ edge}$ represents the sum of currents from common electrode electrical contacts 122 along the common electrode edge that is substantially oriented perpendicular to the shorted address line, that is, first edge 220 as illustrated in FIG. 2(B); and d is the distance of the shored address line 113 from the adjoining adjoining common electrode edge 250 that is oriented parallel to the shored address line and from which $I_{parallel\ edge}$ is measured.

As noted above with respect to the description of the embodiment illustrated in FIG. 2(A), determination of the distance "X" is typically includes the steps of applying the measured current data to a processing device programmed with the selected relationship. or alternatively manually performing the functions of the selected relationship. Determination of distance "X" enables one to localize the short circuit along the shorted address line, thereby reducing the time that is necessary to find and repair the defect.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of locating a short circuit between an address line and a common electrode to facilitate repair of an imager assembly having a plurality of respective x- and y- address lines and a common electrode extending across the imager assembly and having a plurality of electrical contact points disposed at selected intervals along edges of the common electrode, the method comprising the steps of:

identifying a defective address line, said defective address line being electrically shorted to said common electrode;

applying a test voltage to said defective address line, said defective address line having a short circuit to said common electrode at a point along the length L of said defective address line, the defective address line being oriented along a first axis of said imager assembly;

measuring a respective current value at each of the plurality of common electrode contact points that are disposed along two selected opposite edges of the common electrode, each of said opposite edges being disposed substantially perpendicular to said first axis of said imager assembly;

localizing a short circuit location "X" along the length L of the shorted address line, the step of localizing said short circuit location comprising processing the respective current values from said plurality of common electrode contact points in accordance with the following selected relationship:

$$I_{A-N}/I_{a-n}=(L-X)/X$$

wherein:

$I_{A-N}$ represents the sum of measured currents from common electrode contact points along the common electrode first opposite edge;

$I_{a-n}$ represents the sum of measured currents from common electrode contact points along the common electrode second opposite edge;

L represents the length of the shorted address line; and

X represents the point of the short circuit as distance from the common electrode first opposite edge.

2. The method of claim 1 wherein the step of processing the respective measured currents includes the steps of applying the measured currents to the input of a processor device programmed to manipulate said measured currents in accordance with said selected relationship.

3. The method of claim 1 wherein said shorted address line is not electrically conductive from said common electrode first opposite edge to said common electrode second opposite edge.

4. The method of claim 1 wherein said shorted address line is electrically conductive from said common electrode first edge to said common electrode second edge.

5. A method of locating a short circuit between an address line and a common electrode to facilitate repair of an imager assembly having a plurality of respective x- and y- address lines and a common electrode extending across the imager assembly and having a plurality of electrical contact points disposed at selected intervals along edges of the common electrode, the method comprising the steps of:

identifying a defective address line, said defective address line being electrically shorted to said common electrode;

applying a test voltage to said defective address line, said defective address line having a short circuit to said common electrode at a point along the length L of said defective address line, the defective address line being oriented along a first axis of said imager assembly;

measuring a respective current value at each of the plurality of common electrode contact points that are disposed along adjoining edges of the common electrode, said common electrode comprising a first adjoining edge disposed substantially perpendicular to said first axis of said imager assembly and a second adjoining edge disposed substantially parallel to said first axis of said imager:

localizing a short circuit location "X" along the length L of the shorted address line, the step of localizing said short circuit location comprising processing the respective current values from said plurality of common electrode contact points in accordance with the following relationship:

$$X=[\tan((\pi/2)(I_{parallel\ edge}/(I_{parallel\ edge}+I_{perpendicular\ edge})))][d]$$

wherein:

X is the distance of the short along the shorted address line from the first adjoining common electrode edge;

$I_{parallel\ edge}$ is the sum of currents from electrical contacts disposed along the second adjoining common electrode edge;

$I_{perpendicular\ edge}$ is the sum of currents from electrical contacts disposed along the first adjoining common electrode edge; and, d is the distance of the shorted address line from said second adjoining common electrode edge.

6. The method of claim 1 wherein said test voltage has an absolute value in the range between about 1 Volt and 10 Volts.

7. The method of claim 1 wherein the step of measuring current at each of the plurality of common electrode contact points that are disposed along selected edges of the common electrode comprises the step of uniformly biasing each of said common electrode contact points from which current is measured.

8. The method of claim 7 wherein the step of uniformly biasing said common electrode contact points comprises the step of grounding each of said common electrode contact points from which current is measured.

9. The method of claim 6 wherein the step of applying a test voltage to one of said plurality of address lines further comprises the step of not biasing the remaining plurality of address lines that are oriented along said first axis of said imager assembly.

10. The method of claim 5 wherein said test voltage has an absolute value in the range between about 1 Volt and 10 Volts.

11. The method of claim 5 wherein the step of measuring current at each of the plurality of common electrode contact points that are disposed along selected edges of the common electrode comprises the step of uniformly biasing each of said common electrode contact points from which current is measured.

12. The method of claim 11 wherein the step of uniformly biasing said common electrode contact points comprises the step of grounding each of said common electrode contact points from which current is measured.

13. The method of claim 12 wherein the step of applying a test voltage to one of said plurality of address lines further comprises the step of not biasing the remaining plurality of address lines that are oriented along said first axis of said imager assembly.

* * * * *